US009660604B2

(12) United States Patent
Divincenzo (10) Patent No.: US 9,660,604 B2
(45) Date of Patent: May 23, 2017

(54) EFFICIENT PASSIVE BROADBAND GYRATOR

(71) Applicant: FORSCHUNGSZENTRUM JUELICH GMBH, Juelich (DE)

(72) Inventor: David Divincenzo, Voerendaal (NL)

(73) Assignee: FORSCHUNGSZENTRUM JUELICH GMBH, Juelich (DE)

( * ) Notice: Subject to any disclaimer, the term of this patent is extended or adjusted under 35 U.S.C. 154(b) by 0 days.

(21) Appl. No.: 14/770,686

(22) PCT Filed: Mar. 15, 2014

(86) PCT No.: PCT/DE2014/000136
§ 371 (c)(1),
(2) Date: Aug. 26, 2015

(87) PCT Pub. No.: WO2014/166465
PCT Pub. Date: Oct. 16, 2014

(65) Prior Publication Data
US 2016/0079948 A1    Mar. 17, 2016

(30) Foreign Application Priority Data

Apr. 13, 2013  (DE) ................... 10 2013 006 377

(51) Int. Cl.
*H01L 43/06*    (2006.01)
*H03H 7/00*    (2006.01)

(52) U.S. Cl.
CPC ............. *H03H 7/002* (2013.01); *H01L 43/06* (2013.01)

(58) Field of Classification Search
CPC ................................ H03H 7/002; H01L 43/06
(Continued)

(56) References Cited

U.S. PATENT DOCUMENTS 2,464,807 A * 3/1949 Hansen, Jr. .......... G01R 15/202
257/421
2,649,574 A    8/1953 Mason
(Continued)

FOREIGN PATENT DOCUMENTS

DE    11 44 355    2/1963
DE    11 47 278    4/1963
DE    12 89 556    2/1969

OTHER PUBLICATIONS

R. F. Wick: "Solution of the Field Problem of the Germanium Gyrator", Journal of Applied Physics, vol. 25, No. 6, Jan. 1, 1954 (Jan. 1, 1954), p. 741, XP055122858, ISSN: 0021-8979, DOI: 10.1063/1.1721725 p. 741, left-hand column—p. 743, left-hand column; figures 1, 2.
(Continued)

*Primary Examiner* — Dean Takaoka
*Assistant Examiner* — Alan Wong
(74) *Attorney, Agent, or Firm* — Norris McLaughlin & Marcus, P.A.

(57)    ABSTRACT

A gyrator for AC signals comprises a Hall effect material, means for coupling an alternating current ($I_1$; $I_4$) into the Hall effect material, means for permeating a Hall effect material with a magnetic field that is perpendicular to the plane or surface of the material, and means far converting a current ($I_3$; $I_2$), which was generated by the current $I_1$ perpendicularly to the electric field generated by $I_1$ in the Hall effect material, into an output voltage ($U_4$; $U_1$). A transformer is provided between at least one conductor loop (1a; 2a) made of a normal-conducting or semi-conducting material and at least one conductor loop (1; 2) made of the Hall effect material for coupling the current ($I_1$; $I_4$) into the Hall effect material and/or for converting the current ($I_3$; $I_2$) in the Hall effect material into the output voltage ($U_4$; $U_1$). It was found that eliminating an inefficient galvanic coupling
(Continued)

of the Hall effect material to metallic or semi-conducting conductors minimizes the dissipative losses that occur during the conversion of the input current ($I_1$; $I_4$) into the output voltage ($U_4$; $U_1$). The gyrator can thus also be used for highly sensitive experiments in quantum information processing at low temperatures.

18 Claims, 5 Drawing Sheets

(58) Field of Classification Search
USPC .................................................. 333/213–215
See application file for complete search history.

(56) References Cited

U.S. PATENT DOCUMENTS

| | | |
|---|---|---|
| 3,047,821 A | 7/1962 | Hilbinger |
| 3,134,082 A | 5/1964 | Arlt |
| 3,197,651 A * | 7/1965 | Arlt .......................... H01L 43/06 324/251 |
| 3,214,682 A | 10/1965 | Wick |
| 8,502,626 B2 * | 8/2013 | Mikhemar ........... H04B 5/0093 333/215 |

OTHER PUBLICATIONS

Bruna M et al: "Fabrication and characterization of graphene-based quantum hall effect devices at INRIM", Precision Electromagnetic Measurements (CPEM), 2010 Conference on, IEEE, Piscataway, NJ, USA, Jun. 13, 2010 (Jun. 13, 2010), pp. 349-350, XP031729430, ISBN: 978-1-4244-6795-2 the whole document.

Sosso A: "Derivation of an electronic equivalent of QHE devices", Precision Electromagnetic Measurements Digest, 2000 Conference on, IEEE, May 14, 2000 (May 14, 2000), pp. 519-520, XP032400133, DOI: 10.1109/CPEM.2000.851110 ISBN: 978-0-7803-5744-0.

* cited by examiner

EFFICIENT PASSIVE BROADBAND GYRATOR

The invention relates to a gyrator for AC signals

BACKGROUND OF THE INVENTION

A gyrator is an electric two-port network element in which the voltage at the output is proportional to the current at the input, the sign of the voltage changing when the input and output are reversed, if the current is an alternating current, the same is thus converted into either an in-phase alternating voltage or an alternating voltage in phase opposition, depending on the port of the gyrator to which this current is applied. The gyrator is necessary as a fifth linear element, in addition to the resistor, capacitor, inductor and ideal transformer, to realize two-port network elements that allow an alternating voltage to pass only in one direction (isolators), or three-port or multi-port elements that allow an alternating voltage to pass a port only to a next port in a fixed rotational direction (circulators).

So as to render the conversion of the input current into the output voltage dependent on the direction of current through the gyrator, Faraday rotation in ferrites under the influence of an external magnetic field is used in the microwave range. For this purpose, it is necessary for an electromagnetic wave generated by the input current to propagate in the ferrite. The dimensions of the ferrite must therefore be in the order of magnitude of the wavelength, bringing the ferrite to an unpracticable size for frequencies in the radio or audio frequency range. This also ceases to operate efficiently at frequencies below the microwave range. Additionally, as a result of the physical dimensions, every gyrator is limited to a substantially narrow frequency band.

As an alternative, a gyrator may also be realized as an active circuit composed of transistors and fed-back operational amplifiers. Such a circuit, however, requires a power supply unit and produces both noise and heat.

A passive gyrator for lower frequencies is known from U.S. Pat. No. 2,649,574, in which the Faraday rotation in the ferrite is replaced with a planar Hall effect. The disadvantage is that high contact resistances impede both coupling of the current into the Hall effect material and tapping of the Hall voltage, which impairs the efficiency of the gyrator.

It is therefore the object of the invention to provide a gyrator which, at low frequencies in the order of magnitude of 1 to 100 MHz, operates more efficiently than gyrators according to the prior art.

This object is achieved according to the invention by a gyrator according to the main claim. Further advantageous embodiments will be apparent from the dependent claims.

SUMMARY OF THE INVENTION

As part of the invention, a gyrator for AC signals was developed. This gyrator comprises a Hall effect material, means for coupling an alternating current ($I_1$; $I_4$) into the Hall effect material, means for permeating the Hall effect material with a magnetic field that is perpendicular to the plane or surface of the material, and means for converting a current ($I_3$; $I_2$), which was generated by the current perpendicularly to the electric field generated by $I_1$ in the Hall effect material, into an output voltage ($U_4$; $U_1$).

When an alternating current $I_1$ is applied to the first port of the gyrator and driven through the Hall effect material, the electrons carrying this current are deflected perpendicularly to the direction of current by the magnetic field. The overall current is thus imparted a component $I_3$, which is located perpendicularly on the electric field generated by $I_1$. This current can be converted into the output voltage $U_4$. The output voltage $U_4$ can be tapped at the Hall effect material as a Hall voltage perpendicularly to the direction of the current for example. When an alternating current $I_4$ is applied to the second port of the gyrator, the direction of the current component $I_2$ caused by the deflection changes due to the right-hand rule with the same magnetic field direction. Accordingly, the sign of the output voltage $U_1$ reverses.

According to the invention, a transformer is provided between at least one conductor loop made of a normal-conducting or semi-conducting material and at least one conductor loop made of the Hall effect material for coupling the current ($I_1$; $I_4$) into the Hall effect material and/or for converting the current ($I_3$; $I_2$) in the Hall effect material into the output voltage ($U_4$; $U_1$).

It was found that eliminating an inefficient galvanic coupling of the Hall effect material to metallic or semi-conducting conductors minimizes the dissipative losses that occur during the conversion of the input current ($I_1$; $I_4$) into the output voltage ($U_4$; $U_1$). Experiments in quantum information processing at low temperatures on the order of magnitude of 10 mK are so sensitive that they are separated from the measuring electronics using an isolator, so that the measurement signal from the experiment can reach the measuring electronics substantially without impairment, yet the measuring electronics do not backscatter any noise into the experiment. Only an isolator that is based on a passive gyrator can be used for this purpose, since an active gyrator produces both heat and noise. Gyrators based on the Hall effect according to the prior art can likewise not be used for this application since the dissipative losses weaken the measurement signal, produce undesirable heat and, like any ohmic resistance, generate noise. The gyrator according to the invention does not have these disadvantages and can be used for the described experiments. In the absence of other available gyrators, and thus isolators, this gyrator makes several of these experiments practicable for the first time.

The feedthrough of the input current ($I_1$; $I_4$) on the output voltage ($U_4$; $U_1$) thus depends on the strength of the Hall effect in the Hall effect material. This strength is described by the Hall angle $\theta_H$ by which the total current is deflected from the electric field generated by $I_1$ due to the Hall effect material. The Hall effect material is thus advantageously a material having a Hall angle $\theta_H$ of at least 80 degrees at a magnetic field strength of 1 T. For this purpose, the Hall effect material advantageously comprises a metalloid, in particular a metalloid from the group arsenic, α-tin (gray tin), antimony, bismuth or graphite, and/or a doped semi-conductor. The strength of the Hall effect is essentially a product of intrinsic material properties (primarily the charge carrier density) and the magnetic field strength. The more strongly the Hall angle deviates from 90 degrees, the more strongly is the input current ($I_1$; $I_4$) reflected by the gyrator.

The transformer provided according to the invention limits the field of application of the gyrator to AC signals. However, operation with frequencies as low as approximately 50 Hz is possible.

If are provided both for incoupling and for the conversion, advantageously the conductor loops of the two transformers, which are made of the normal-conducting or semi-conducting material, are inductively decoupled from each other. An input current then causes an output voltage $U_4$ only via the Hall effect of the Hall effect material, and conversely an input current $I_4$ also causes an output voltage $U_1$ only via this Hall effect. A directly induced output voltage, circumventing the Hall effect, would have the disadvantage that a reversal of input and output would not change the sign.

In a particularly advantageous embodiment of the invention, the Hall effect material is a quantum Hall effect material. In such materials, $\theta_H$ deviates only by immeasurably small amounts from 90 degrees. The input current $I_1$ is then practically fully transformed into the perpendicular current $I_3$ within the Hall effect material, which is converted into the output voltage $U_4$. The quantum Hall effect occurs in many very thin materials and structures. The quantum Hall effect material advantageously comprises graphene and/or a semiconductor heterostructure which forms a two-dimensional electron gas.

In a particularly advantageous embodiment of the invention, the Hall effect material is disposed in at least two segments such that, when a magnetic field is applied, an electromotive force in one segment produces a current flow primarily in the other segment. The input current ($I_1$; $I_4$) then produces an electromotive force in the one segment, which is converted by the Hall effect into a current flow through the other segment. This current flow, in turn, is inductively converted into the output voltage ($U_4$; $U_1$).

This is, for example, implemented in a particularly advantageous embodiment of the invention. In this embodiment, the Hall effect material forms at least two conductor loops 1 and 2, which are electrically connected to each other at one point and intersect without electrical connection at least at one other point. This intersection may be implemented, for example, by one conductor loop crossing above or below the other, wherein it is separated from the other conductor loop by a gap and/or by an insulating material. The one conductor loop, however, may also traverse the other and be separated from the same by a gap and/or by an insulating material. The conductor loops are not limited to a circular shape, but can take on any shape.

For example, the Hall effect material can be implemented in the form of a spiral, having the ends thereof brought close to one of the windings at a shared intersecting point or electrically contacted with this intersecting point.

In a particularly advantageous embodiment of the invention, the one conductor loop (1; 2) is the secondary winding of the transformer for incoupling the input current ($I_1$; $I_4$) and/or the second conductor loop (2; 1) is the primary winding of the transformer for converting the current ($I_3$; $I_2$) in the Hall effect material into the output voltage ($U_4$; $U_1$). The two conductor loops then each fulfill a dual function. On the one hand, they separate the component ($I_3$; $I_2$) of interest of the total current in the Hall effect material into one of the conductor loops. On the other hand, they each form one half of the transformer for incoupling or conversion, whereby additional parts used for this can be eliminated.

In a particularly advantageous embodiment of the invention, the Hall effect material occupies a three-dimensional area, which can be represented by moving a two-dimensional area on a closed path in the space. This area can be a torus, for example. A torus is created by moving a circle as a two-dimensional area along a larger circle in the three-dimensional space.

The Hall effect material may in particular be disposed as a layer on an insulating substrate and/or the three-dimensional area may form a hollow body from the Hall effect material. The effect of bath is that there are only current paths along the three-dimensional area, and no parasitic current paths through a solid Hall effect material. The Hall effect material can be grown onto the insulating substrate or be applied to this substrate using a coating technique.

The three-dimensional area automatically comprises conductor loops 1 and 2, which are electrically connected to each other at one point and intersect without electrical connection at least at one other point. The first conductor loop is a path in the Hall effect material along the closed path or parallel to this path. The second conductor loop 2 is a path in the Hail effect material along the circumference of the two-dimensional area at a point on the closed path. This conductor loop is ideally located perpendicularly on the first conductor loop. The two conductor loops 1 and 2 function as described above.

The arrangement in the three-dimensional area has the advantage of allowing implementation of particularly good inductive coupling of the input current ($I_1$; $I_4$) into the one conductor loop (1; 2) and particularly good inductive conversion of the current ($I_3$; $I_2$) in the Hall effect material into the output voltage ($U_4$; $U_1$). The gyrator thus becomes more efficient in the overall.

One path in the Hall effect material along the closed path or parallel to this path is thus advantageously the secondary winding of the transformer for incoupling the input current ($I_1$; $I_4$), or the primary winding of the transformer for converting the current ($I_3$; $I_2$) in the Hall effect material into the output voltage ($U_4$; $U_1$). The other winding of the transformer can then be a coil, for example, which is wound along the closed path or parallel to this path.

As an alternative or in combination therewith, one path in the Hall effect material along the circumference of the two-dimensional area, at a point on the closed path, is thus advantageously the secondary winding of the transformer for incoupling the input current ($I_1$; $I_4$), or the primary winding of the transformer for converting the current ($I_3$; $I_2$) in the Hall effect material into the output voltage ($U_4$; $U_1$). The other winding of the transformer can then be a coil, for example, which is wound along the circumference of the two-dimensional area.

A spatially homogeneous magnetic field is not suitable for a gyrator disposed on a three-dimensional area in the described manner. Instead, it must be locally ensured that the magnetic field is located perpendicularly to the three-dimensional area. The larger the proportion of the area on which this can be realized, the more efficiently will the gyrator operate. The Hall effect material thus advantageously has at least one opening for feeding magnetic field lines through the three-dimensional area. As an alternative or in combination therewith, a magnetic multipole arrangement is advantageously provided for permeating the Hall effect material with the magnetic field.

Advantageously, means are provided for generating a local auxiliary electric field on at least one location in the three-dimensional area. Using a field effect, it is then possible to fine-tune the local electron density, and thus the Hall effect. In this way, potential inhomogeneities in the local component of the magnetic field which is perpendicular to the three-dimensional area can be corrected. In order to fine-tune the magnetic field itself, it is possible to dispose magnetically permeable materials in the three-dimensional area, in the body enclosed by this area, or in the surroundings thereof.

The subject matter of the invention will be described hereafter based on the figures, without thereby limiting the subject matter of the invention. In the drawings.

BRIEF DESCRIPTION OF THE DRAWINGS

DESCRIPTION OF THE PREFERRED EMBODIMENTS

Figure 1:
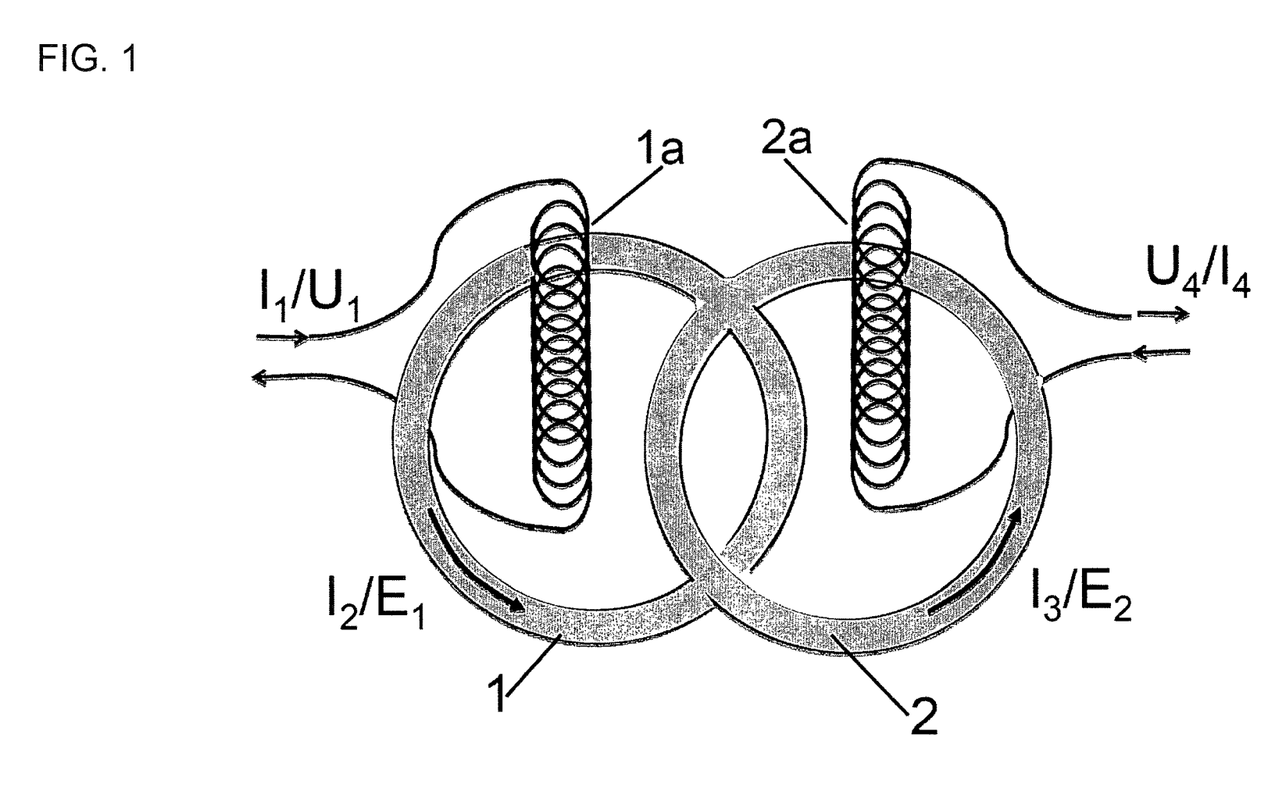
FIG. 1: shows an exemplary embodiment of the gyrator according to the invention comprising two conductor loops made of Hall effect material.

FIG. 1 shows a schematic illustration of an exemplary embodiment of the gyrator according to the invention. The Hall effect material is segmented into two conductor loops 1 and 2. The magnetic field, which is not shown for the sake of clarity, is homogenous in this space and located perpendicularly to the drawing plane. Coils 1a and 2a are wound around the conductor loops 1 and 2, respectively. An input current $I_1$, which is coupled in via the coil 1a, produces an electromotive force $E_1$ in conductor loop 1. The Hall effect converts this electromotive force into a current $I_3$ through conductor loop 2. This current induces the output voltage $U_4$ in the coil 2a. If, conversely, an input current $I_4$ flows through the coil 2a, this produces an electromotive force $E_2$ in conductor loop 2. As a result of the right-hand rule, the Hall effect converts this electromotive force $E_2$ into a current $I_2$ through conductor loop 1 which is 180° phase-shifted in relation to the input current, at the same magnetic field direction. This current induces the output voltage $U_1$ in the coil 1a, which is likewise 180° phase-shifted in relation to the input current $I_4$.

Figure 2A:
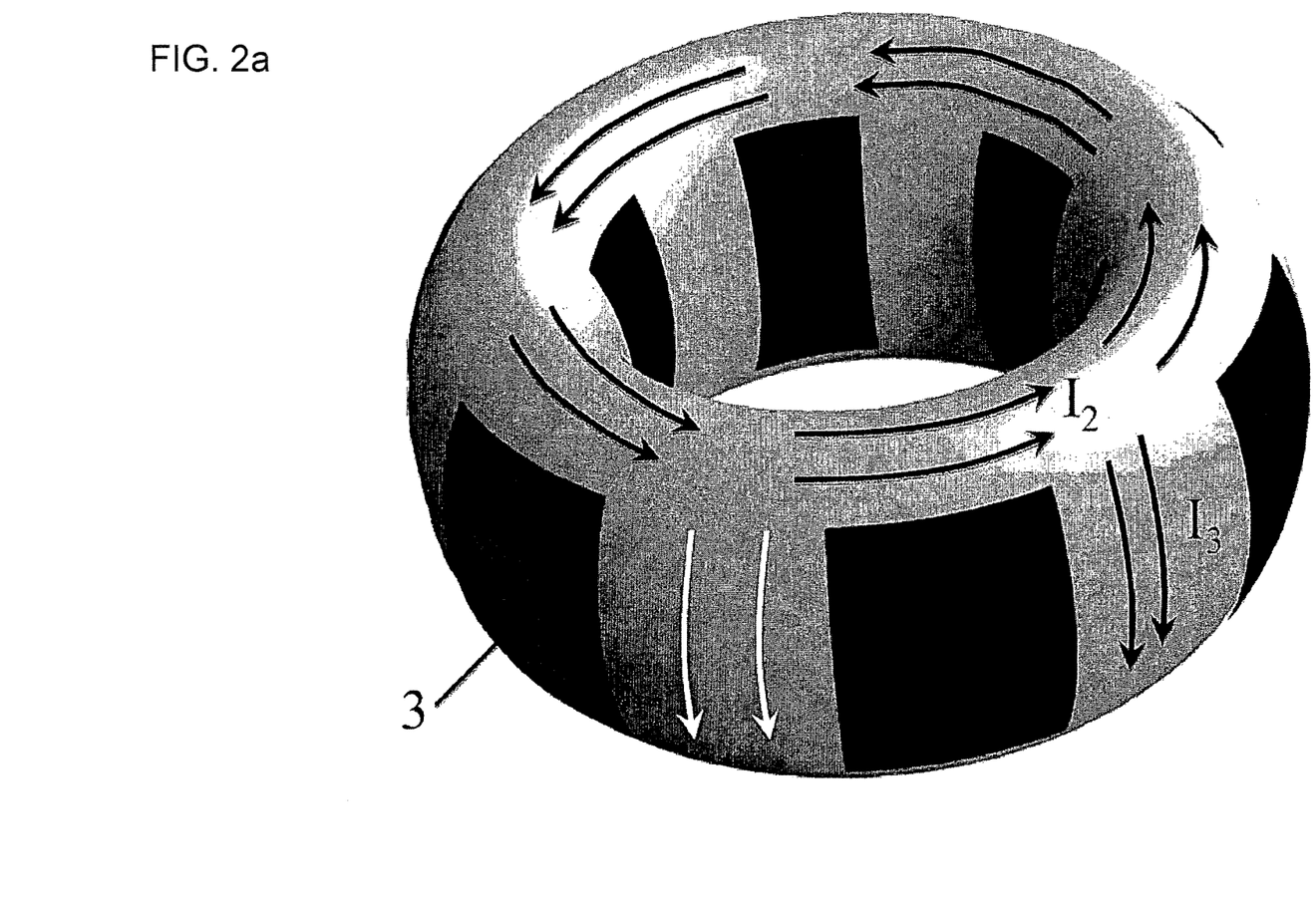
FIG. 2: shows an exemplary embodiment of the gyrator according to the invention comprising a Hall effect material on a torus surface (a) having two current paths along the torus surface, which are inductively connected to the outside via coils (b, c)

FIG. 2 shows a further exemplary embodiment of the gyrator according to the invention. The Hall effect material is disposed on the surface of a torus here (FIG. 2a). The grid of lines covering this surface is only intended to illustrate the three-dimensional structure for visual purposes; the layer made of the Hall effect material is continuous in the light gray regions. The layer is only interrupted by the regions 3 shown in black, in which no current conduction can take place. These regions are used to allow a magnetic multipole field to pass through the torus surface, so that a magnetic field perpendicular to this surface is present substantially everywhere on this surface. Additionally, these regions are used to form defined regions in which the current $I_3$ can flow along the circumference of the circle, the movement of which created the torus along a larger circle. In the direction perpendicular thereto, the current $I_2$ can flow parallel to the larger circle.

Figure 2B:
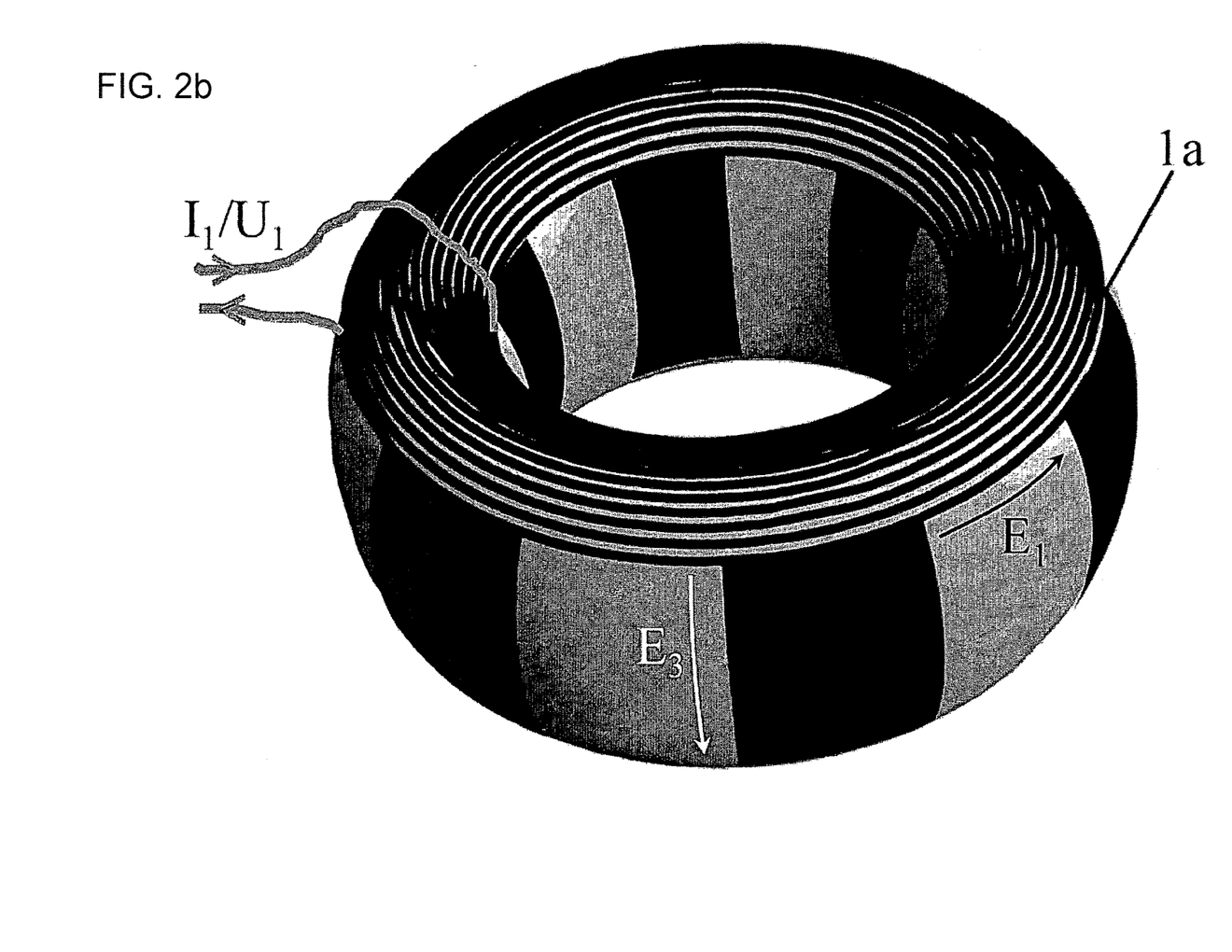

FIG. 2b shows a coil 1a for inductively coupling the current path for $I_2$ shown in FIG. 2a to the outside. When an input current $I_1$ is coupled into the coil, an electric field $E_1$ is generated along the current path for $I_2$, the field being converted via the Hall effect into a current $I_3$ in the direction perpendicular thereto. If, conversely, an electromotive force acts along the path for the current $I_3$, the Hall effect produces a current $I_2$, which induces the output voltage $U_1$ in the coil. For optimal action of the gyrator, the spatial profile of the coil should be approximated as closely as possible to the spatial distribution of the current $I_2$. Moreover, a second, identical coil is advantageously connected in series to the coil shown in FIG. 2b on the lower face of the torus. The coil is electrically insulated with respect to the Hall effect material.

Figure 2C:
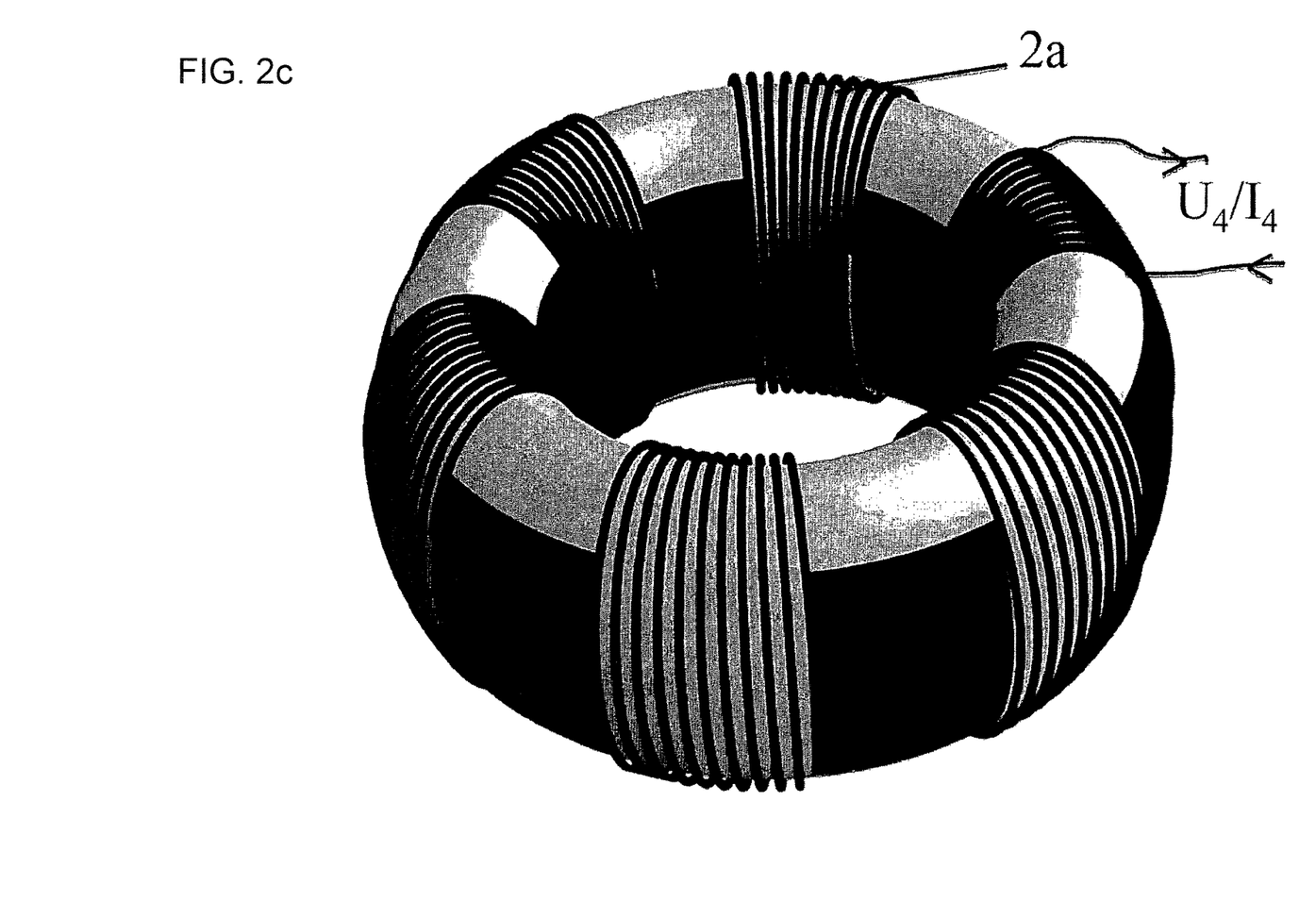

FIG. 2c shows a coil 2a for inductively coupling the current path for $I_3$ shown in FIG. 2a to the outside. The different pieces along the larger one of the two circles defining the torus are connected in series. When, due to an input current a current $I_3$ flows through the coil 1a, this current is converted into the output voltage $U_4$ by the coil 2a. When, conversely, the coil 2a is acted on by the input current $I_4$, an electromotive force $E_3$ is generated along the path for the current $I_3$, the force being converted by the Hall effect into a current $I_2$ and inducing the output voltage $U_1$ in the coil 1a. The coil 2a is electrically insulated both with respect to the coil 1a and with respect to the Hall effect material. There is also no direct inductive coupling between the coils 1a and 2a. For optimal action of the gyrator, the spatial profile of the coil should be approximated as closely as possible to the spatial distribution of the current $I_3$. The coil 2a may entirely or partially cover the regions 3 shown in black, in which no current conduction is possible.

The two coils 1a or 2a can each be located on the inner side or on the outer side of the torus surface. It is also immaterial whether coil 1a is located above coil 2a, or vice versa.

Figure 3:
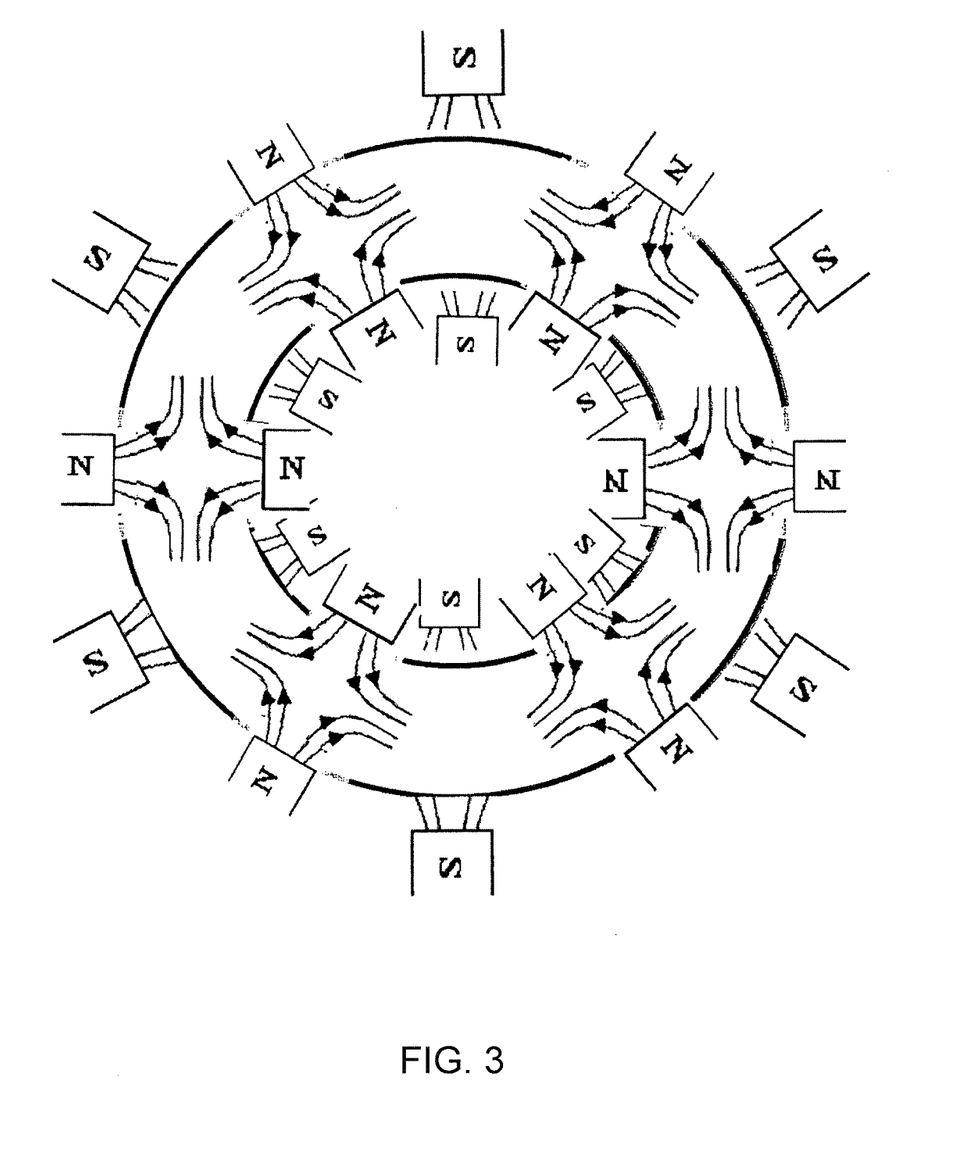
FIG. 3: shows a magnetic multipole arrangement for realizing a homogeneous perpendicular field along the torus surface.

FIG. 3 shows a sectional view of a magnetic multipole arrangement, which generates a homogeneous perpendicular magnetic field on the surface of the torus, in the equatorial plane of the torus. The field lines originating from magnetic north pass through the regions 3 in which the Hall effect material is interrupted, enter the torus, and exit the torus again perpendicularly in the direction of the magnetic south through the regions to which the Hall effect material is applied. Advantageously further magnets are provided on the outer surface of the torus, such as above and below the drawing plane, so as to provide further magnetic souths there, so that additional field lines perpendicularly exit the surface there.

The invention claimed is:

1. A gyrator for AC signals, comprising a Hall effect material, means for coupling an alternating current ($I_1$; $I_4$) into the Hall effect material, means for permeating the Hall effect material with a magnetic field that is perpendicular to the plane or surface of the material, means for converting a current ($I_3$; $I_2$), which was generated by the current $I_1$ perpendicularly to the electric field generated by $I_1$ in the Hall effect material, into an output voltage ($U_4$; $U_1$), wherein
a transformer provided between at least one conductor loop made of a normal-conducting or semi-conducting material and at least one conductor loop made of the Hall effect material for coupling the current ($I_1$; $I_4$) into the Hall effect material and/or for converting the current ($I_3$; $I_2$) in the Hall effect material into the output voltage ($U_4$; $U_1$), and
the Hall effect material is disposed in at least two segments such that, when a magnetic field is applied, an electromotive force in one segment produces a current flow primarily in the other segment.

2. The gyrator according to claim 1, comprising a second transformer between at least one other conductor loop made of a normal-conducting or semi-conducting material and at least one other conductor loop made of the Hall effect material for coupling the current ($I_1$; $I_4$) into the Hall effect material and/or for converting the current ($I_3$; $I_2$) in the Hall effect material into the output voltage ($U_4$; $U_1$), wherein the conductor loops of the two transformers, which are made of the normal-conducting or semi-conducting material, are inductively decoupled from each other.

3. The gyrator according to claim 2, wherein the Hall effect material forms at least two conductor loops (1) and (2), which are electrically connected to each other at one point and intersect without electrical connection at least at one other point.

4. The gyrator according to claim 3, wherein the one conductor loop (1; 2) is the secondary winding of one of the two transformers, said one of the two transformers being configured for incoupling the input current ($I_1$; $I_4$) and/or the second conductor loop (2; 1) is the primary winding of the transformer other of the two transformers, said other of the two transformers being configured for converting the current ($I_3$; $I_2$) in the Hall effect material into the output voltage ($U_4$; $U_1$).

5. The gyrator according to claim 3, wherein the one conductor loop (1; 2) is the secondary winding of one of the two transformers, said one of the two transformers being configured for incoupling the input current ($I_1$; $I_4$) and/or the second conductor loop (2; 1) is the primary winding of the other of the two transformers, said other of the two transformers being configured for converting the current ($I_3$; $I_2$) in the Hall effect material into the output voltage ($U_4$; $U_1$).

6. The gyrator according to claim 1, wherein the Hall effect material is a quantum Hall effect material.

7. The gyrator according to claim 6, wherein the quantum Hall effect material comprises graphene and/or a semiconductor heterostructure, which forms a two-dimensional electron gas.

8. The gyrator according to claim 1, wherein the Hall effect material forms at least two conductor loops (1) and (2), which are electrically connected to each other at one point and intersect without electrical connection at least at one other point.

9. The gyrator according to claim 1, wherein the Hall effect material comprises a metalloid, in particular a metalloid from the group arsenic, α-tin (gray tin), antimony, bismuth or graphite, and/or a doped semiconductor.

10. The gyrator according to claim 1, wherein the Hall effect material occupies a three-dimensional area, which can be represented by moving a two-dimensional area on a closed path in the space.

11. The gyrator according to claim 10, wherein the Hall effect material is disposed as a layer on an insulating substrate and/or the three-dimensional area forms a hollow body from the Hall effect material.

12. The gyrator according to claim 11, wherein one path in the Hall effect material, along the closed path or parallel to this path, is the secondary winding of the transformer for incoupling the input current ($I_1$; $I_4$), or the primary winding of the transformer for converting the current ($I_3$; $I_2$) in the Hall effect material into the output voltage ($U_4$; $U_1$).

13. The gyrator according to claim 10, wherein one path in the Hall effect material, along the circumference of the two-dimensional area, at a point on the closed path, is the secondary winding of the transformer for incoupling the input current ($I_1$; $I_4$), or the primary winding of the transformer for converting the current ($I_3$; $I_2$) in the Hall effect material into the output voltage ($U_4$; $U_1$).

14. The gyrator according to claim 10, wherein the three-dimensional area is a torus.

15. The gyrator according to claim 10, wherein the Hall effect material has at least one opening for feeding magnetic field lines through the three-dimensional area.

16. The gyrator according to claim 10, comprising a magnetic multipole arrangement for permeating the Hall effect material with the magnetic field.

17. The gyrator according to claim 10, further comprising means for generating a local electric auxiliary field in at least one location in the three-dimensional area.

18. The gyrator according to claim 1, wherein the Hall effect material is a material having a Hall angle $\theta_H$ of at least 80 degrees at a magnetic field strength of 1 T.

* * * * *